United States Patent [19]

Clemans

[11] Patent Number: 4,946,542

[45] Date of Patent: Aug. 7, 1990

[54] CRYSTAL GROWTH METHOD IN CRUCIBLE WITH STEP PORTION

[75] Inventor: Jim E. Clemans, Hopewell Township, Mercer County, N.J.

[73] Assignee: AT&T Bell Laboratories, Murray Hill, N.J.

[21] Appl. No.: 280,059

[22] Filed: Dec. 5, 1988

[51] Int. Cl.$^5$ .................. C30B 27/00; C30B 29/00
[52] U.S. Cl. .................. 156/607; 156/616.41; 156/DIG. 93; 422/248
[58] Field of Search ............... 156/616.1, 616.2, 616.3, 156/616.4, 616.41, 607, DIG. 70, DIG. 93; 422/248; 164/122.2

[56] References Cited

U.S. PATENT DOCUMENTS 4,404,172  9/1983  Gault ................................ 422/248
4,632,686  12/1986  Brown et al. ....................... 65/18.1

FOREIGN PATENT DOCUMENTS 131725  7/1978  German Democratic Rep. .................................. 156/616.1

OTHER PUBLICATIONS

B. A. Joyce, "Growth of Single Crystals of GaAs in Bulk and Thin Film Form" included in the book, *Crystal Growth*, edited by B. R. Pamplin, Permanon Press, 1975, pp. 157–184.

J. B. Mullin et al., "Liquid Encapsulation Techniques: The Use of an Inert Liquid in Suppressing Dissociation During the Melt-Growth of InAs and GaAs Crystals" included in the *Journal of Physical Chem. Solids*, vol. 26, pp. 782–784, 1965.

H. H. Woodbury, "Vertical-Gradient-Freeze Growth of GaP" included in the *Journal of Crystal Growth*, vol. 35, pp. 49–54, 1976.

*Primary Examiner*—Melvyn J. Andrews
*Attorney, Agent, or Firm*—Roderick B. Anderson

[57] ABSTRACT

In a VGF process for growing a large single crystal 16' in a crucible 11, the problem of stress forces caused by a freezing liquid encapsulant are solved by using a step or indentation 21 around the inner surface of the crucible 11 at or near the top of the single crystal 16' being grown. As a consequence, the newly-frozen single crystal (e.g., InP)conforms to the shape of the indented inner surface of the crucible and therefore has a pronounced bulge 22 near its top. The bulge of the frozen semiconductor crystal then nests against the indentation on the periphery of the crucible, thereby to prevent any liquid encapsulant from flowing between the crystal and the wall of the crucible.

12 Claims, 2 Drawing Sheets

CRYSTAL GROWTH METHOD IN CRUCIBLE WITH STEP PORTION

TECHNICAL FIELD

This invention relates to processes for growing large single-crystal semiconductors and, more particularly, to processes for growing large single crystals of Group III–V or Group II–VI semiconductor compounds.

BACKGROUND OF THE INVENTION

One of the most significant developments in semiconductor technology in recent years has been the increased use and importance of compound semiconductors. Particularly significant are the Group III–V semiconductor compound devices composed of elements of Groups III and V of the periodic table, such as gallium arsenide (GaAs) and indium phosphide (InP). Compound semiconductors are used in such devices as lasers, light-emitting diodes, microwave oscillators and amplifiers, and various types of light detectors.

Most such commercial use of compound semiconductors requires the growth of large single-crystal ingots from which wafers can be cut for the subsequent fabrication of useful devices. One of the more promising methods for such crystal growth is the vertical gradient freeze (VGF) method, particularly the VGF method defined in the W. A. Gault U.S. Pat. No. 4,404,172, granted Sept. 13, 1983, and assigned to Western Electric Company, Inc., which is hereby incorporated herein by reference. According to this method, polycrystalline starting material is placed in a vertically extending crucible including a small cylindrical seed well portion at its bottom end which snugly contains a seed crystal. Initially, the starting material and a portion of the seed crystal are melted. The power to the system is then reduced in such a manner that freezing proceeds vertically upwardly from the seed crystal. The major advantage of the VGF method is that crystals with very low dislocation densities can be produced using low thermal gradients and slow rates of cooling.

It is well-known that the Group III–V compounds tend to dissociate at higher temperatures, with the more volatile Group V element escaping into the vapor phase. Several approaches have been developed to prevent or retard this tendency during crystal growth. For example, in one approach to the growth of InP, escape of the more volatile phosphorus component is retarded by providing a vapor pressure of phosphorus vapor over the melt from a separately heated reservoir of phosphorus within the sealed growth container. It is also known that Group V material loss from the melt may be retarded with the use of any of various materials such as boric oxide ($B_2O_3$), barium chloride ($BaCl_2$), or calcium chloride ($CaCl_2$) which act as diffusion barriers. Such additives, having a lower density than the molten indium phosphide, rise to the surface, encapsulate the melt, and, together with an inert gas pressure in the vessel, can contain the volatile vapors; see, for example, the paper of "Growth of Single Crystals of GaAs in Bulk and Thin Film Form," by B. A. Joyce, included in the book, *Crystal Growth*, edited by B. R. Pamplin, Pergamon Press, 1975, pp. 157–184 at p. 165 and the paper by J. B. Mullen et al., "Liquid Encapsulation Techniques: The Use of an Inert Liquid in Suppressing Dissociation During the Melt-Growth of InAs and GaAs Crystals," *Journal of Physical Chem. Solids*, Volume 26, pp. 782–784, 1965.

One problem with using a liquid encapsulant as described above is that, after the crystal freezing process, the liquid encapsulant may flow into a gap between the frozen single crystal and the crucible wall. Subsequently, the encapsulant in the gap itself freezes, which creates stresses that can damage either the crystal or the crucible.

SUMMARY OF THE INVENTION

In accordance with the invention, the problem of differential thermal stress forces caused by a solidified encapsulant is solved by using, in a crystal growth process, a larger diameter portion around the inner surface of the crucible at or near the top of the single crystal being grown. As a consequence, the newly-frozen single crystal (e.g., InP) conforms to the shape of the stepped inner surface of the crucible and therefore has a pronounced bulge near its top. The bulge of the frozen semiconductor crystal then nests against the step on the periphery of the crucible, thereby blocking the flow of liquid encapsulant between the crystal and the wall of the crucible.

These and other objects, features, and advantages of the invention will be better understood from a consideration of the following detailed description taken in conjunction with the accompanying drawing.

DETAILED DESCRIPTION

Figure 1:
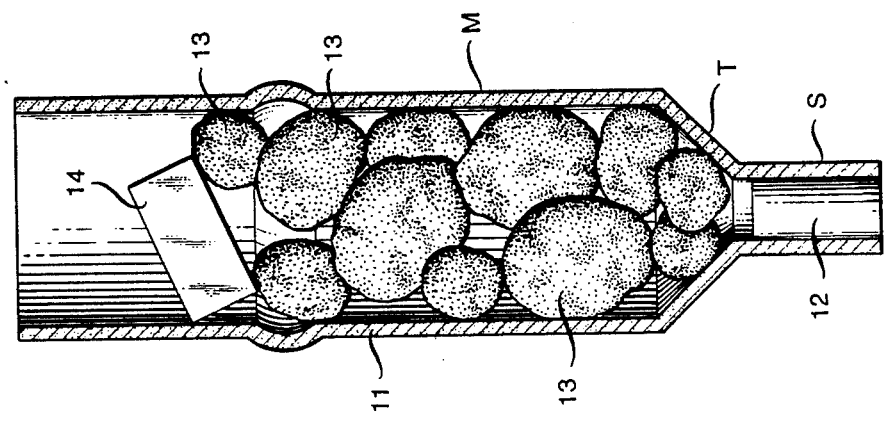

Referring now to FIG. 1, there is shown a crucible 11 of the type used in the VGF process for growing large single crystals of compound semiconductors, particularly III–V semiconductors such as indium phosphide (InP). The crucible 11 comprises a generally cylindrical major portion M, a frustoconical transition portion T and a cylindrical seed well portion S, and is arranged vertically with the seed well portion at the bottom during crystal growth. As described in detail in the aforementioned U.S. patent of W. A. Gault, a cylindrical seed crystal 12 of the material to be grown is snugly fitted into the seed well portion S. Most of the remaining part of the crucible is then filled with a quantity 13 of a polycrystalline or amorphous form of the crystal to be grown, such as polycrystals of InP. The crucible is supported within an autoclave that includes a heater for melting the polycrystals and part of the seed crystal. In the case, for example, of InP, the autoclave also includes a portion for heating phosphorus to provide a phosphorus partial pressure at the top of the melt for helping to maintain the composition of the melt. For the sake of brevity and clarity, the autoclave and associated structure have not been shown.

Figure 2:
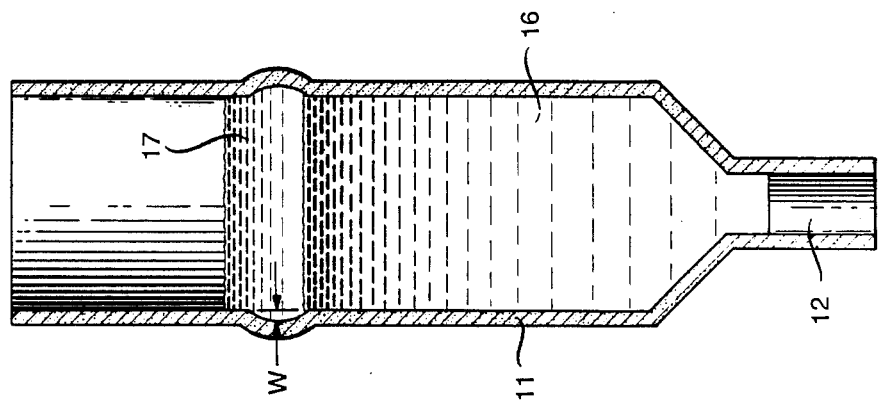
FIGS. 1–4 are schematic sectional views of a crucible for growing a single-crystal ingot of a compound semiconductor material, illustrating the process at successive stages, in accordance with an illustrative embodiment of the invention.

Also included with the raw material is a quantity 14 of a material that can act as a suitable encapsulant during the crystal growth process. For example, if indium phosphide is to be grown, the material 14 may be boric oxide, which is capable of floating on the liquid indium phosphide and acting as a diffusion barrier to the escape of volatile phosphorus vapors. This is illustrated in FIG. 2, which depicts the next step of the crystal growth process, namely, the step of melting both the polycrystals of indium phosphide to make liquid indium phosphide 16 and the encapsulant material so as to make liquid boric oxide 17 that floats on the liquid indium phosphide. In accordance with the VGF process, the seed crystal 12 is only partially melted at this stage. It should be noted that before complete melting of the InP polycrystals, the molten boric oxide may not fully encapsulate the molten indium phosphide; during this stage the phosphorus partial pressure provided by the autoclave is the primary agent for containing volatile phosphorus within the molten InP.

Figure 3:
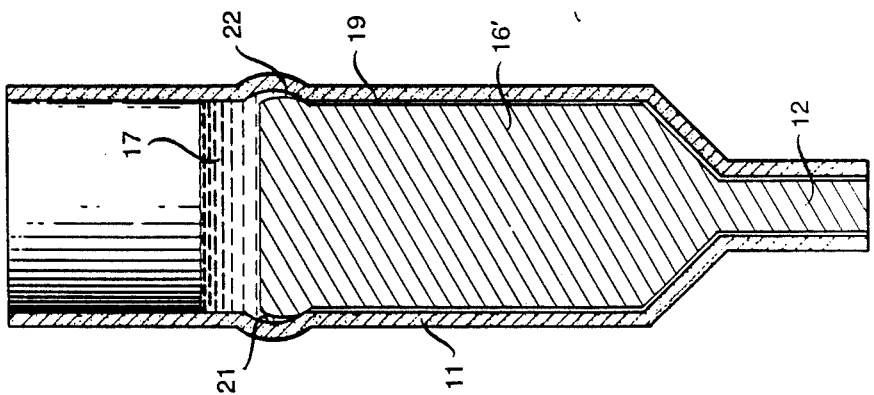

Referring to FIG. 3, after all of the raw material and a part of the seed has been melted, the power to the primary heater is reduced such that the semiconductor solidifies on the remaining seed crystal 12, and such solidification proceeds vertically upwardly. If the process proceeds as intended, the entirety of the molten indium phosphide will solidify into a single crystal 16', with the crystal orientation determined by that of the seed crystal. As shown in FIG. 3, the original seed crystal 12 and the newly-frozen crystal 16' become one unitary body. At this stage the boric oxide 17 is still liquid both because freezing proceeds in a vertically upwardly direction and because boric oxide has a lower freezing point than indium phosphide.

The transition of the InP from the liquid phase to the solid phase expands its bulk so that the upper surface of crystal 16' is above the upper surface of the liquid InP 16 of FIG. 2. As the crystal is cooled further from its freezing point, however, such cooling causes a contraction of the crystal 16' so as to form a gap 19 between the outer periphery of the crystal and the inner surface of crucible 12. In the absence of any provision, liquid boric oxide 17 could flow into gap 19 where it could damage either the single crystal 16' or the crucible 12 when it in turn is frozen. For example, one can see that if boric oxide were to freeze in gap 19, consequent stress due to the different thermal expansions of the crystal, crucible and boric oxide could cause cracking or crazing of the crystal 16'.

In accordance with the invention, this problem is solved by including on the inner surface of the crucible 11 a peripheral step or indentation 21. In its liquid state, the indium phosphide conforms to the indentation 21, so that upon freezing the crystal contains a peripheral bulge 22. This bulge is fully formed when the crystal 16' has completed freezing. As a consequence, when the crystal 16' contracts due to subsequent cooling so as to form the gap 19, the bulge 22 nests within indentation 21 to make a dependable seal that prevents liquid boric oxide 17 from entering gap 19. It should be noted that bulge 22 is normally formed before gap 19 because the gap is a manifestation of contraction of the crystal after freezing. Thus, the weight of crystal 16' is sufficient to cause the boric oxide 17 to be sealed from gap 19 (by the force of gravity) as gap 19 is being formed.

Figure 4:
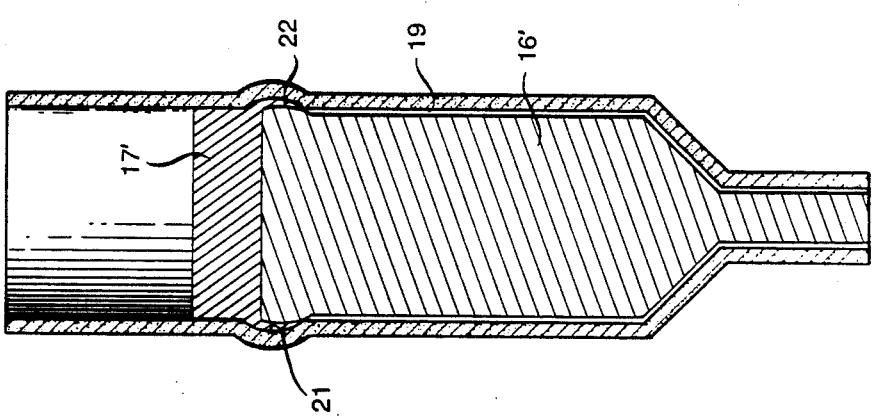

Referring to FIG. 4, with subsequent cooling, the boric oxide likewise freezes to define a solid boric oxide layer 17' contained on the top of the solid indium phosphide crystal 16'; no frozen boric oxide is formed in gap 19. At this stage the process is completed, and the crystal 16' and boric oxide layer 17' can be removed from the crucible. The crucible may be quartz and may be broken to remove the crystal ingot.

The crucible 11 may also be made of boron nitride or other refractory material, as is known, and may have the following dimensions: 10 inches in overall length; 2 inches inner diameter and 8 inches in length of the major portion M; and 0.25 inches inner diameter and 1.0 inches in length of the seed well portion S. With these dimensions, the major portion M may be made to have an indentation having a maximum dimension W (shown in FIG. 2) with respect to the cylindrical inner wall of 0.02 to 0.04 inches. An indentation of this small magnitude has been found sufficient to give the nesting of an indium phosphide crystal within the indentation, as described before, so as to give a dependable seal that prevents substantially any flow of liquid boric oxide into the gap 19.

One advantage of the crucible configuration of FIGS. 1-4 is that the indentation can easily be made in quartz by mounting the major portion M on a lathe, heating with a torch to soften an annular portion, and then introducing a puff of air into the crucible for making the annular bulge that defines the step or indentation 21, all in accordance with known glass-blowing techniques. A disadvantage is that the crucible ordinarily must be broken to remove the ingot. If the process specifications require, for example, a crucible of pyrolytic boron nitride, this may be a considerable disadvantage because boron nitride crucibles are more expensive than quartz, and they are usually reused.

Figure 5:
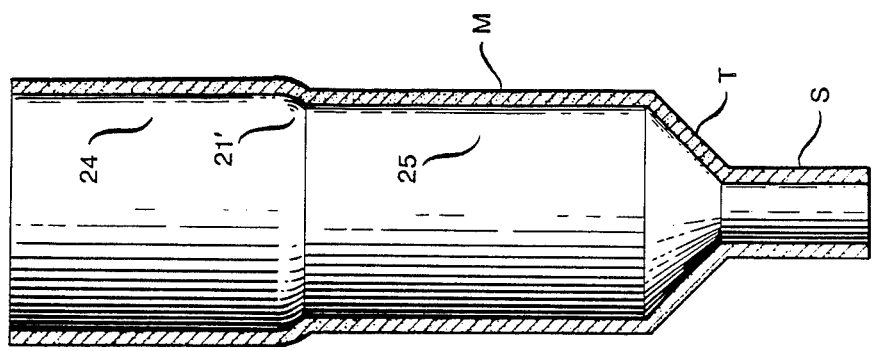
FIG. 5 is a schematic sectional view of a crucible, illustrating another embodiment of the invention.

Accordingly, boron nitride crucibles may be made with the configuration shown in FIG. 5. In the FIG. 5 embodiment, the major portion M of the crucible comprises a cylindrical upper portion 24 and a cylindrical lower portion 25 of smaller diameter than the upper portion and communicating with the upper portion by a step portion 21'. It can be seen that after freezing the ingot can easily be removed from the open end of the large cylindrical portion 24 without breaking the crucible.

The removal process of the indium phosphide ingot typically includes exposure to methanol and/or hot water, as is known, which dissolves the boric oxide. Minor exfoliation of boron nitride from the inner surface of the crucible frequently occurs. Thereafter, the crucible is cleaned and used for subsequent crystal growth operations.

While we refer to the invention as being one for making large single crystals, it is to be understood that ingots containing more than one crystal grain can nevertheless be useful if single-crystal wafers can be cut from them. Use of the invention is not limited to the VGF process, but may be useful wherever encapsulants or crucible coating agents are used in crystal growth. Specifically, it may find use in the crystal growth techniques known as the Vertical Bridgman method, the Vertical Stockbarger method and the Horizontal Bridgman and Horizontal Stockbarger method; in all of these known techniques, flow of encapsulant into a gap could be a problem for which the invention may provide a solution. It may be possible to use the liquid encapsulant to form the required indentation by a controlled reaction. For example, we have found that boric oxide reacting with the inner wall of a quartz crucible will dissolve a small part of the quartz to make an indentation which is suitable; that is, when the InP crystal freezes, it expands into the indented or cavitated portion of the crucible to form a bulge around its top that prevents any flow of boric oxide into a gap between the crystal and the crucible. This reaction is accelerated by the addition of a small quantity of H₂O or P₂O₅. The invention may be used in the growth of any of various Group III-V or Group II-VI compounds. For example, an encapsulant may be used for containing volatile tellurium in the growth of the II-VI compound cadmium telluride. The invention may be useful with liquid encapsulants other than boric oxide, such as barium chloride and calcium chloride, as are known. Various other embodiments and modifications may be made by those skilled in the art without departing from the spirit and scope of the invention.

I claim:

1. A process for making large single crystals of a semiconductor material comprising the steps of: introducing into the bottom part of a crucible a relatively small monocrystalline seed crystal of the material; introducing over the seed crystal a quantity of raw material from which the single crystal may be made and an encapsulant material; heating the crucible to melt the raw material, the encapsulant material, and part of the seed crystal; the molten encapsulant material having a lower density than the molten semiconductor material so as to float on the molten semiconductor material; and freezing the semiconductor material such that it extends as substantially a single crystal from the seed crystal, wherein:

the inner surface of the crucible has a larger periphery portion and a smaller periphery portion defining therebetween a step portion extending around the periphery of the inner surface of the crucible;

at least part of the larger periphery portion is located between the molten encapsulation material, as it is supported on the frozen semiconductor material, and the smaller periphery portion;

the larger periphery portion causes the frozen large single crystal to have a bulge in a portion of its outer periphery, whereby, when the molten semiconductor material freezes, the bulge in the outer periphery of the frozen semiconductor crystal nests against the step portion around the inner surface of the crucible, thereby to prevent molten encapsulant material from flowing between the semiconductor crystal and the crucible.

2. The process of claim 1 wherein:

the portion of the crucible in which the step portion is made constitutes a section of a cylinder; and the step portion is a ring-shaped indentation.

3. The process of claim 2 wherein:

the semiconductor material is a Group III-V material; the encapsulant material is boric oxide; and the crucible is made of quartz.

4. The process of claim 1 wherein:

the process for making large single crystals is a vertical gradient freeze process.

5. The process of claim 2 wherein:

the ring-shaped indentation is made by making a ring-shaped bulge around the wall of the crucible.

6. The process of claim 1 wherein:

the step portion is defined by a step between an upper cylindrical portion of the crucible and a lower cylindrical portion of the crucible of smaller inner diameter than the upper cylindrical portion.

7. The process of claim 6 wherein:

the semiconductor material is a Group III-V material; the encapsulant is boric oxide; and the crucible is made of pyrolitic boron nitride.

8. A VGF process for making large single crystals of a Group III-V semiconductor material comprising the steps of: introducing into the bottom part of a crucible a monocrystalline seed crystal of the Group III-V material; introducing over the seed crystal a quantity of Group III-V material in polycrystalline or amorphous form and a quantity of an encapsulant material, which in its liquid phase has a lower density than the liquid form of the Group III-V material; heating the crucible to melt the quantity of Group III-V material, the encapsulant material and part of the seed crystal; and freezing the Group III-V material such that it progressively freezes in a vertically upward direction, to form a crystal, the top of which is the last part thereof to freeze; characterized in that:

the crucible is made to have a step portion extending around the periphery of its inner surface at a location near the top of the frozen Group III-V material crystal, the crucible having a larger cross-sectional area between the top of the frozen crystal and the step portion than in a downward direction from the step portion, whereby, when the Group III-V material freezes, it has a bulge near its top which, by gravity, nests against the step portion to seal a lower portion of the frozen Group III-V crystal from the liquid encapsulant and to prevent the liquid encapsulant from flowing between the newly-frozen crystal and the crucible.

9. The process of claim 8 further characterized in that:

the Group III-V material is indium phosphide; and the encapsulant material is boric oxide.

10. The process of claim 9 further characterized in that:

the crucible is made of quartz; and the step portion is defined by a bulge extending around a cylindrical portion of the crucible.

11. The process of claim 9 further characterized in that:

the crucible is made of pyrolitic boron nitride; and the step portion is defined by a step between an upper cylindrical portion of the crucible and a lower cylindrical portion of the crucible of smaller inside diameter than the upper cylindrical portion.

12. The process of claim 8 further characterized in that:

the step portion is made by a reaction between the encapsulant and the crucible which dissolves part of the crucible wall.

* * * * *